United States Patent
Iida et al.

(10) Patent No.: US 7,001,870 B2
(45) Date of Patent: Feb. 21, 2006

(54) METHOD FOR JOINING OXIDE SUPERCONDUCTORS AND JOINED OXIDE SUPERCONDUCTOR

(75) Inventors: Kazumasa Iida, Morioka (JP); Junko Yoshioka, Morioka (JP); Naomichi Sakai, Matsudo (JP); Masato Murakami, Tokyo (JP)

(73) Assignee: International Superconductivity Technology Center, The Juridical Foundation, Tokyo (JP)

( * ) Notice: Subject to any disclaimer, the term of this patent is extended or adjusted under 35 U.S.C. 154(b) by 333 days.

(21) Appl. No.: 10/343,962

(22) PCT Filed: Jun. 12, 2002

(86) PCT No.: PCT/JP02/05836

§ 371 (c)(1),
(2), (4) Date: Feb. 5, 2003

(87) PCT Pub. No.: WO03/002483

PCT Pub. Date: Jan. 9, 2003

(65) Prior Publication Data

US 2003/0148891 A1 Aug. 7, 2003

(30) Foreign Application Priority Data

Jun. 29, 2001 (JP) .............................. 2001-197713

(51) Int. Cl.
*H01B 12/00* (2006.01)
*C04B 101/00* (2006.01)
*B32B 7/10* (2006.01)

(52) U.S. Cl. ..................... 505/126; 505/234; 505/925; 427/62; 428/930

(58) Field of Classification Search ................ 505/126, 505/450, 234, 925; 156/47; 427/62, 207.1; 228/198; 428/903, 930
See application file for complete search history.

(56) References Cited

U.S. PATENT DOCUMENTS 5,521,150 A * 5/1996 Murakami et al. .......... 505/450
5,786,304 A   7/1998 Kimura et al.
6,429,174 B1 * 8/2002 Sengupta .................... 505/234

FOREIGN PATENT DOCUMENTS

JP          1-160877         6/1989

(Continued)

OTHER PUBLICATIONS

Joining of high current bulk Y-Ba-Cu-O superconductors, by K. Salama et al, Appl. Phys. Lett., vol. 60, No. 7, 1992, pp. 898-900.

(Continued)

*Primary Examiner*—Mark Kopec
(74) *Attorney, Agent, or Firm*—Flynn, Thiel, Boutell & Tanis, P.C.

(57) ABSTRACT

The present invention provides a method for joining an RE123 oxide superconductor matrix obtained by a melt process by the use of a solder material. The (110) plane of an RE123 oxide superconductor matrix obtained by a melt process is used as the plane to be joined, a solder material composed of an RE123 oxide superconductor having a lower melting point than the above-mentioned RE123 oxide superconductor is interposed between the planes to be joined, and this solder material is melted and then solidified to form a joining layer, thereby joining the matrices. The solder material can be a sinter, a melt-processed material, a powder, a slurry, or a molded powder.

11 Claims, 11 Drawing Sheets

FOREIGN PATENT DOCUMENTS

| | | |
|---|---|---|
| JP | 1-242473 | 9/1989 |
| JP | 3-8777 | 1/1991 |
| JP | 3-16966 | 1/1991 |
| JP | 4-104970 | 4/1992 |
| JP | 5-279028 | 10/1993 |
| JP | 6-40775 | 2/1994 |
| JP | 6-211588 | 8/1994 |
| JP | 7-17774 | 1/1995 |
| JP | 7-82049 | 3/1995 |
| JP | 10-84141 | 3/1998 |
| JP | 2828396 | 9/1998 |
| JP | 2001-114576 | 4/2001 |

OTHER PUBLICATIONS

Joining of $YBa_2Cu_3O_x$ with High Critical Current, by K. Kimura et al, Advances in Superconductivity VII, Springer-Verlag, Tokyo, 1988, pp. 681-684.

* cited by examiner

Y123 ORIENTED BULK MATERIAL

4mm
5mm
3mm

C AXIS DIRECTION

C AXIS DIRECTION

C AXIS DIRECTION

POLISHED TO MIRROR FINISH

SPACER (250, 500, OR 800 μm)

C AXIS DIRECTION

POLISHED FACE

C AXIS DIRECTION

MgO SINGLE CRYSTAL

CHARACTERISTIC X-RAY IMAGE (Ba-Mα)

CHARACTERISTIC X-RAY IMAGE (Cu-Kα)

COMPOSITION IMAGE

MAGNIFIED IMAGE

SAMPLE

200Oe

600Oe

1000Oe

1400Oe

SAMPLE

200Oe

600Oe

1000Oe

1400Oe

METHOD FOR JOINING OXIDE SUPERCONDUCTORS AND JOINED OXIDE SUPERCONDUCTOR

FIELD OF TECHNOLOGY

The present invention relates to a method for joining oxide superconductors, and to a joined oxide superconductor that has been joined by this method.

BACKGROUND TECHNOLOGY

Superconducting oxide materials with a high superconducting transition temperature ($T_c$), such as $LiTi_2O_3$, $Ba(Bi,Pb)O_3$, $(Ba, K)BiO_3$, $(La, Sr)_2CuO_4$, $REBa_2Cu_3O_{7-\delta}$ (RE is a rare earth element), $Bi_2Sr_2Ca_2Cu_3O_{10}$, $Tl_2Ba_2Ca_2Cu_3O_{10}$, or $HgBa_2Ca_2Cu_3O_8$, have been discovered one after another in recent years. Superconductors composed of these materials are able to generate a powerful electromagnetic force through interaction with a magnetic field, and their practical application in various fields in which this force is utilized, such as bearings, flywheels and load transport system has therefore been studied.

Of these superconducting oxide materials, those based on $REBa_2Cu_3O_{7-\delta}$ in particular (hereinafter referred to as "RE123 oxide superconducting materials"; the RE here is one or more members of the group consisting of Y, La, Pr, Nd, Sm, Eu, Gd, Dy, Ho, Er, Tm, Yb, and Lu) have a high critical temperature. In addition, they have a high critical current density in a magnetic field due to development and improvement in their manufacturing technology and recently have become one of the most noteworthy superconducting materials.

It has also become clear that superconductors with such a large critical current can function as permanent magnets by trapping a strong magnetic field or, conversely, can shield a strong magnetic field, so in addition to the applications mentioned above, applications such as magnetic shields and permanent magnets are also on the horizon.

The most common method to produce an oxide superconductor (bulk) is a "melt solidification process," in which a molten oxide superconducting material (crystal precursor) is solidified while being slowly cooled from near its solidification temperature, the result being the growth of crystals. Another manufacturing method is the "supercooling melt solidification process," in which the crystal growth time is shortened. This method involves supercooling a molten crystal precursor down to a temperature below the solidification temperature while the precursor is still in a molten or semimolten state, then slowly cooling from this temperature or maintaining this temperature to grow crystals. The goal here is to raise the crystal growth rate through supercooling (Japanese Patent Publication H6-211588).

Still, the surface area of a superconducting oxide material needs to be increased if the superconductor is to be used as a magnetic shield or other such material as mentioned above. Furthermore, oxide superconductors have anisotropy in materials properties depending on their crystal orientation, with the current flowing mainly in the a-b direction of the crystals, so for them to be used as a magnetic shield, the sample should be installed so that the c axis is perpendicular to the magnetic field.

However, at the present time the bulk superconductors obtained by the above method are only a few centimeters at the largest size, and it is extremely difficult to produce larger superconductors.

This means that a large superconductor must be produced by joining small superconductor blocks.

Some of the joining methods known in the past are introduced below.

(1) K. Salama and V. Selvamanickem (*Appl. Phys. Lett.* 60 (1992), 898)

Samples are joined, without any deterioration of superconducting properties at the joined interface, by heating $YBa_2Cu_3O_{7-\delta}$ superconductors (Y123), which were produced by melt process, for approximately 30 hours under uniaxial pressure of 2 to 6 MPa at a temperature between 910 and 930° C., without interposing solder material between the joined interfaces.

(2) "Advances in Superconductivity VII," Springer-Verlag, Tokyo, 1995, pp. 681–684

A matrix of a Y123 superconducting bulk ($Y_{1.8}Ba_{2.4}Cu_{3.4}O_y$) is prepared. A powder solder of a Yb123 superconducting material ($Y_{1.2}Ba_{2.1}Cu_{3.1}O_y$) produced by melt solidification process and having a lower melting point (peritectic point) than the matrix is sandwiched between said matrices. The temperature is raised to between the melting point of the matrix and that of the solder to bring the solder into a semimolten state. This is then gradually cooled to epitaxially grow crystals of the solder material (Yb123 crystals) from the matrix surface, joining the matrices together via this crystallized solder.

(3) Japanese Patent Publication H7-82049

A component that will enter the liquid phase at the joining temperature or a component that readily undergoes high-temperature creep, such as a composition based on Ag, $BaCuO_2$—CuO or $REBa_2Cu_3O_{7-\delta}$ (RE=Y, Ho, Er, Tm, Yb) is interposed by coating, vapor deposition, or another such method at the joined interface between matrices of a yttrium-based oxide superconductor produced by the melt solidification process. After that, this sample is heated under pressure for 1 to 10 hours at a temperature of 900 to 990° C. to fuse it, and then the sample is cooled at a rate of 2° C./hour or less to join the matrices together.

If we use the above joining method (2) as an example of a conventional joining technique, the following problems are encountered.

Specifically, when a solder is sandwiched between matrices and then heated and slowly cooled, the Yb123 crystallization of the semimolten solder gradually proceeds from the Y123 matrix surface toward the center of the solder. So, the final solidified portion of the solder forms unreacted non-superconductive layer at the middle location of the thickness of the solder sandwiched between the matrices.

The solder (crystal precursor) that has been heated to a high temperature and becomes a semimolten liquid phase includes a non-superconducting BaO—CuO melt and a non-superconducting Yb211 phase. This Yb211 phase reacts with the melt, forming superconducting Yb123 crystals while solidifying, however, a mixture of the above-mentioned non-superconducting portion such as Yb211 phase and BaO—CuO tends to remain in a layer form in the final solidified portion. Also, the solder that has become a semimolten liquid phase contains numerous voids, impurities, and so on, and these also tend to remain as a layer in the final solidified portion.

This is in part due to the so-called "pushing" effect, in which the Yb211 phase, BaO—CuO, impurities, voids and so forth is pushed forward the unsolidified middle portion of the solder. That is caused by the epitaxial growth of Yb123 crystals from the matrix surface toward the middle of the solder during gradual cooling after heating.

FIG. 9 consists of schematic diagrams illustrating this "pushing" effect. FIG. 10 is a schematic diagram illustrating a joint at which pores and segregation products are present as a result of this pushing.

For example, a solder of a Yb123 superconducting material composition is sandwiched between Y123 superconducting bulk matrices and heated until the solder becomes semimolten, as shown in FIG. 9(a). This semimolten solder includes a Yb211 phase, bubbles, and so forth, which are contained in the molten BaO—CuO. As these slowly cool, as shown in FIG. 9b, the Yb211 phase reacts with the BaO—CuO melt, which produces superconducting Yb123 crystals that grow from the Y123 matrix surface toward the center of the solder. The Yb211, bubbles, and so forth present in the unsolidified melt here are pushed away from the growth front of the Yb123 crystal and concentrate in the middle part of the unsolidified solder. As the Yb123 crystals continue to grow and the solder reaches its final solidification stage, as shown in FIG. 9(c), the unreacted Yb211 phase, bubbles, and so forth segregate increasingly towards the center of the solder. The un-reacted Yb211 phase, bubbles, and so forth finally segregate in layer form over the entire cross section of the middle part of the solder, in which state the solidification of the solder is completed, joining the Y123 matrices.

Since the Yb211 phase, bubbles, and so forth are not superconducting, the superconducting characteristics of a joined oxide superconductor by the above method, especially in this joined portion, are markedly degraded.

DISCLOSURE OF THE INVENTION

It is an object of the present invention to provide a solution to the drawbacks encountered with the conventional joining methods, and more specifically it is an object to provide a method for joining an RE123 oxide superconductor that will result in no segregation of impurities and pores in the joined portion.

It is a further object of the present invention to provide a strongly coupled RE123 oxide superconductor obtained by the above joining method.

As a result of diligent research aimed at solving the above problems, the inventors learned the following about the joining of RE123 superconductor matrices.

(a) A good joint will be obtained if the plane to be joined of the matrix is parallel to the (110) crystallographic plane.

(b) In the case of (a) above, a better joint will be obtained if a high density RE123 superconductor compact such as a sinter and melt-processed plate that has a lower melting point than the matrix is selected as the solder material and if the material is heated, melted and solidified.

The inventors perfected the present invention on the basis of the above findings, and aspects of the present invention are as follows.

(1) A method for joining an RE123 oxide superconductor (RE: one or more members of the group consisting of Y, La, Pr, Nd, Sm, Eu, Gd, Dy, Ho, Er, Tm, Yb, and Lu) produced by a melt process, comprising:
aligning a plane to be joined of an RE123 oxide I superconductor so as to be parallel to the (110) crystallographic plane;
interposing a solder material composed of an RE123 oxide superconductor material (RE: one or more members of the group consisting of Y, La, Pr, Nd, Sm, Eu, Gd, Dy, Ho, Er, Tm, Yb, and Lu) having a lower melting point than the RE123 oxide superconductor between the planes to be joined; and melting and then solidifying said solder material to form a joining layer.

(2) The method of (1) above, wherein the solder material is a sinter or a melt-processed plate.

(3) The method of (2) above, wherein a surface of the solder material is finely polished.

(4) The method of (1), wherein the solder material is a powder, a slurry, or a molded powder.

(5) The method of any of (1) to (4) above, wherein the RE123 oxide superconductor contains a non-superconducting phase including RE.

(6) The method of claim 5, wherein the non-superconducting phase is an $RE_2BaCuO_5$ phase (RE211 phase) and/or an $RE_{4-x}Ba_{2+x}Cu_2O_{10-y}$ phase (RE422 phase, $0 \leq x \leq 0.2$, $0 \leq y \leq 0.5$).

(7) The method of (5) above, wherein the non-superconducting phase is an $RE_2BaCuO_5$ phase (RE211 phase) and/or an $RE_{4-2x}Ba_{2+2x}Cu_{2-x}O_{10-y}$ phase (RE422 phase, $0 \leq x \leq 0.3$, $0 \leq y \leq 0.6$).

(8) The method of any of (1) to (7) above, wherein the RE123 oxide superconductor contains one or more members of the group consisting of Ag, Pt, $CeO_2$, and $Ag_2O$.

(9) The method of any of (1) to (8) above, wherein the solder material contains one or more members of the group consisting of Ag, Pt, $CeO_2$, and $Ag_2O$.

(10) The method of any of (1) to (9) above, wherein a pressure is applied during joining.

(11) A joined RE123 oxide superconductor, in which the (110) planes of a plurality of RE123 oxide superconductors (RE: one or more members of the group consisting of Y, La, Pr, Nd, Sm, Eu, Gd, Dy, Ho, Er, Tm, Yb, and Lu) produced by a melt process have been joined with a solder material composed of an RE123 oxide superconductor material (RE: one or more members of the group consisting of Y, La, Pr, Nd, Sm, Eu, Gd, Dy, Ho, Er, Tm, Yb, and Lu) having a lower melting point than the RE123 oxide superconductor to be joined.

BEST MODE OF CARRYING OUT THE INVENTION

Figure 1:
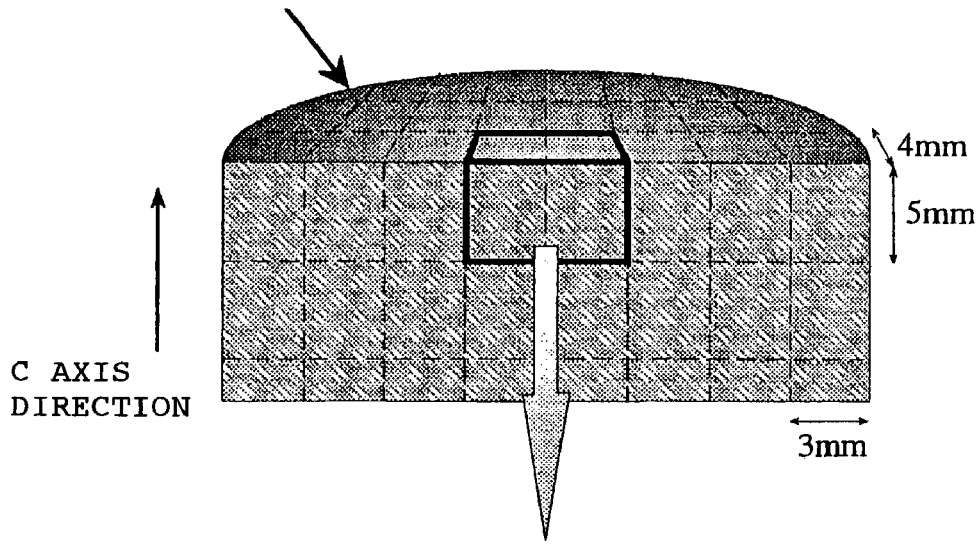
FIG. 1 is a diagram illustrating the method employed in a sample joining test.
Figure 1:
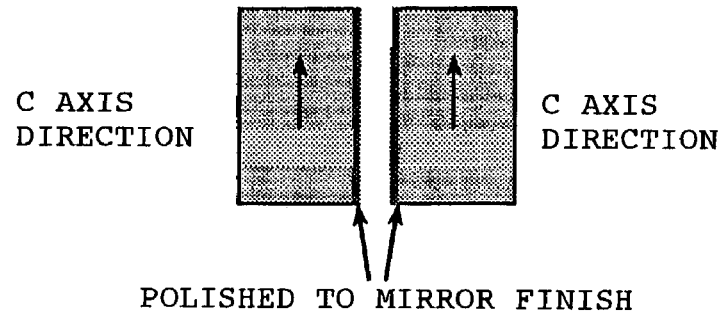
Figure 1:
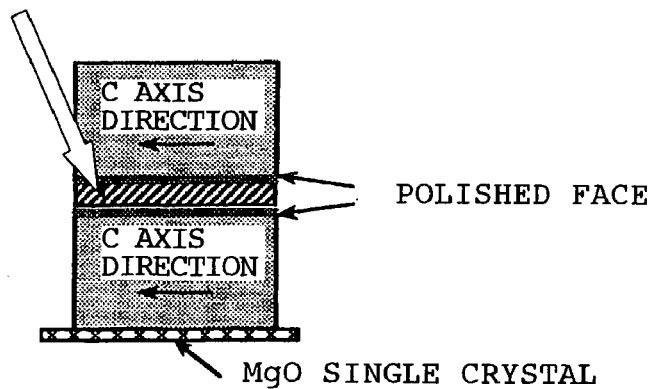

Embodiments of the present invention will now be described in detail.

(Crystal Orientation of the Matrix Plane to be Joined)

In the past, the (100) plane has been employed as the orientation of the plane to be joined in the joining of RE123 superconductor matrices.

In contrast, tests conducted by the inventors into the orientation of the plane to be joined have revealed that better joining is possible if the orientation of the face is parallel to the (110) crystallographic plane.

Therefore, in the present invention, the (110) plane is used as the RE123 superconductor plane to be joined. While it is preferable for the joined plane to be parallel to the (110) plane, it does not have to be parallel the (110) in the strict sense. Deviation from this orientation up to about 15° is permissible, although 7° or less is preferred. The phrase "the plane to be joined of the RE123 oxide superconductor is parallel to the (110) plane" as used in this Specification encompasses the abovementioned case in which the deviation is within 15°.

(Superconductor Matrix)

The superconductor matrix to which the method of this invention is applied is an RE123 oxide superconductor (where RE is one or more members of the group consisting of Y, La, Pr, Nd, Sm, Eu, Gd, Dy, Ho, Er, Tm, Yb, and Lu), and is expressed by the general formula $REBa_2Cu_3O_{7-\delta}$. In order to increase the critical current of the above-mentioned RE123 oxide superconductor, a non-superconducting phase including RE may be dispersed in the matrix phase of the RE123 oxide superconductor. Examples of this non-superconducting phase include an $RE_2BaCuO_5$ phase (RE211) and an $RE_{4-x}Ba_{2+x}Cu_2O_{10-y}$ phase (RE422 phase, $0<x<0.2$, $0<y<0.5$) (see Japanese Patent Publication 2,828,396).

This $RE_{4-x}Ba_{2+x}Cu_2O_{10-y}$ phase can also be expressed as an $RE_{4-2x}Ba_{2+2x}Cu_{2-x}O_{10-y}$ phase, and both forms of notation will be used in the present invention.

The RE123 oxide superconductor of the matrix may contain one or more members of the group consisting of Ag, Pt, $CeO_2$, and $Ag_2O$. In this case the platinum and $CeO_2$ have the effect of finely dispersing RE211 and RE422 in the RE123, while the silver and $Ag_2O$ have the effect of increasing the mechanical strength of a composite (bulk) of RE123+RE211 or RE422.

(Solder Material)

An RE123 oxide superconductor (where RE is one or more members of the group consisting of Y, La, Pr, Nd, Sm, Eu, Gd, Dy, Ho, Er, Tm, Yb, and Lu) having a lower melting point than the matrix is used as the solder material.

Since the melting point of an RE123 oxide superconductor varies with the RE used, the RE of the solder material is appropriately selected according to the type of matrix being used so that the melting point of the solder material will be lower than the melting point of the matrix.

The solder material, just as with the matrix, may contain an RE221 and an RE422 as a dispersion phase, and one or more members of the group consisting of Ag, Pt, $CeO_2$, and $Ag_2O$ may also be contained for the same reasons as those given for the matrix.

The following is a favorable example of a material that can be used for the solder material.

$$(1-x)\ REBa_2Cu_3O_{7-\delta} + xRE_2BaCuO_5 + y\ \text{mass \% A}$$

Where

RE is one or more members of the group consisting of Y, La, Pr, Nd, Sm, Eu, Gd, Dy, Ho, Er, Tm, Yb, and Lu, y is the proportion (mass %) against $(1-x)\ REBa_2Cu_3O_{7-\delta} + xRE_2BaCuO_5$ defined as 100 mass %, where $0 \leq y \leq 40$, and A is one or more members of the group consisting of Ag, Pt, $CeO_2$, and $Ag_2O$.

The solder material can be used in the form of either a powder, a slurry, a molded powder, a sinter, or a melt-processed plate, but a sinter or a melt-processed plate is preferable.

The present invention is characterized in that the face of the matrix to be joined is parallel to the (110) plane. Even in this case, using a sinter or a melt-processed plate as the solder material will yield a better joint than when a powder, slurry, or molded powder is used. The reason for this is following. When a powder, slurry, or molded powder is used as the solder material, the air present between the powder particles cannot escape even in the course of the melting and solidification of the solder, and therefore forms bubbles that remain in the joint. Whereas, when the solder material is a sinter or a melt-processed plate, since the solder material is closely packed, there is less air between the particles, so air is less apt to remain in the joint. When the solder material is a sinter or a melt-processed plate, since solder material is present at a higher density during heating and melting, the melt phase of the solder material more readily undergoes epitaxial growth on the matrix crystal surface in the recrystallization process.

In the joining method of the present invention, the solder material is melted and then solidified to form the joining layer. In this case, the term "melted" as used in reference to the solder material in this Specification also encompasses a semimolten state in which recrystallization is possible.

EXAMPLES

Examples of the present invention will now be given along with comparative examples, but the present invention is not limited to or by these examples.

Example 1

Joining a Y—Ba—Cu—O Bulk with an Er—Ba—Cu—O Solder Material

Preparation of Matrix

A yttrium-based superconducting oxide material bulk (single domain with c-axis orientation; QMG made by Nippon Steel Corporation) was cut into a 3×4×5 mm³ (a plane to be joined was 4×5 mm²) rectangular parallelepiped such that the plane to be joined was parallel to the (110) plane. The surface of this cut sample to be joined was polished to a mirror finish to produce a matrix to be joined (hereinafter referred to as "matrix A").

Preparation of Solder Material

Raw powders of $Er_2O_3$, $BaCO_3$, and CuO were weighed out such that the composition would be $0.75ErBa_2Cu_3O_{7-\delta} +$ 0.25Er$_2$BaCuO$_5$, and these were mixed for 3 hours in an automated mortar and pestle. The mixed powder was molded in a uniaxial press, after which it was calcined for 24 hours at 890° C. in a pure oxygen atmosphere. This calcination was repeated until all of the raw powder became two phases of ErBa$_2$Cu$_3$O$_{7-\delta}$ and Er$_2$BaCuO$_5$.

Platinum was added to the mixed powder having two phases in an amount of 0.5 mass % with respect to the total mass of the mixed powder, and this was mixed for another 3 hours in an automated mortar and pestle. After this mixing, the mixture was molded into a rectangular parallelepiped approximately 18×9×5 mm$^3$ in size, and then pressed in a cold isostatic press (hereinafter referred to as CIP).

This molding was sintered by heating for 10 hours under atmospheric conditions and at 975° C., which is 10° C. lower than 985° C., which is the peritectic reaction temperature of the ErBa$_2$Cu$_3$O$_{7-\delta}$.

The sinter thus obtained was cut into a plate with a thickness of approximately 1 mm, and further polished to produce a spacer with a thickness of 0.5 mm. The spacer was polished until both sides had a mirror finish.

Joining

This spacer with a thickness of 0.5 mm was sandwiched between two cut bulks as shown in FIG. 1.

The sample was heated for 3 hours to 995° C., held at this temperature for 1 hour, and then cooled to 945° C. at a rate of 0.5° C. per hour.

Evaluation

Figure 2:
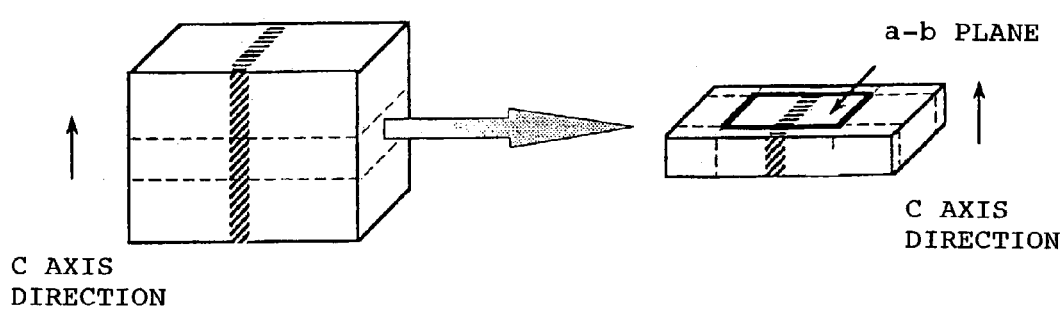
FIG. 2 is a diagram illustrating the shape of the sample for measuring the joined sample.

After the heat treatment, a sample to be measured was cut from the obtained joined product so as to include the joined interface as shown in FIG. 2, part of this was polished in order to observe the microstructure at the joined interface, and the other part was subjected to oxygen annealing for 150 hours at 520° C. in an oxygen atmosphere in order to evaluate the superconductivity.

Figure 3:
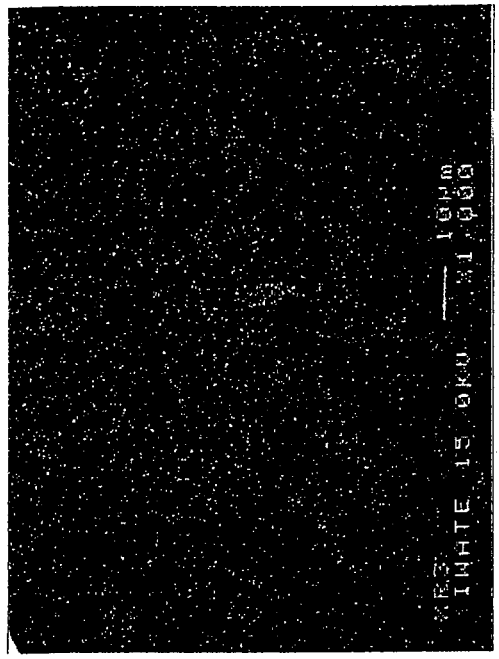
FIG. 3 consists of compositional images and characteristic X-ray images near the joined interface of the joined product of the present invention using the (110) plane to be joined.
Figure 3:
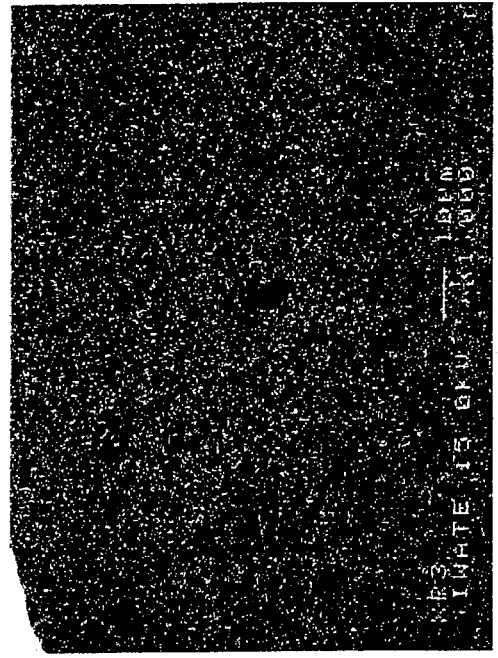
Figure 3:
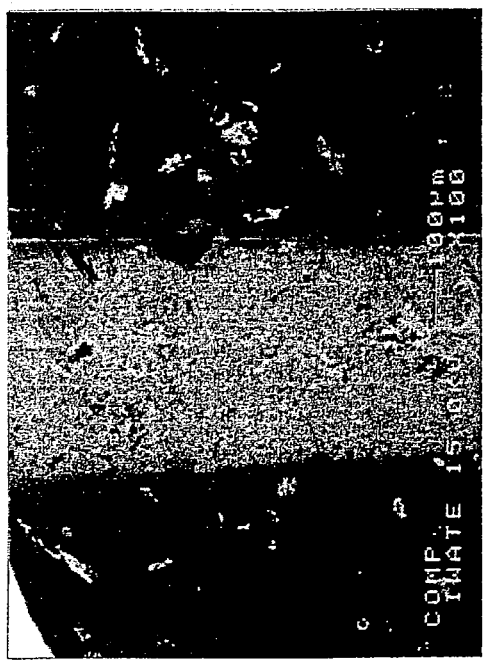
Figure 3:
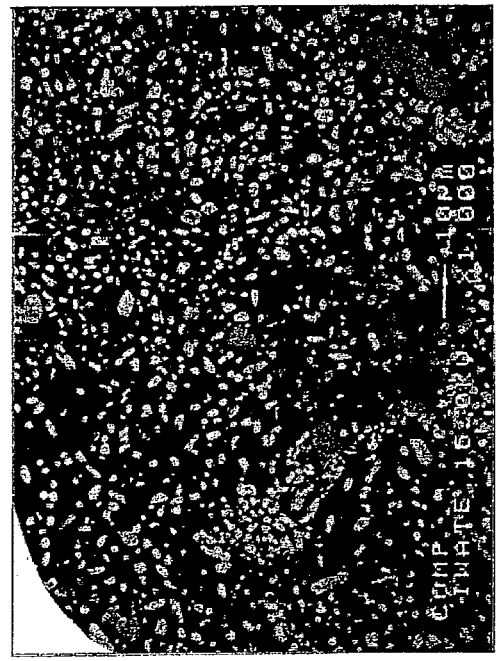

FIG. 3 consists of composition images and characteristic X-ray images (Ba-Mα line and Cu-Kα line) near the joined interface. It can be seen that the joined portion is extremely dense, with no pores visible, indicating that the joining process is successful. Furthermore, it can be seen that there is no segregation of CuO or the like, indicating that the microstructure is extremely uniform.

Figure 4:
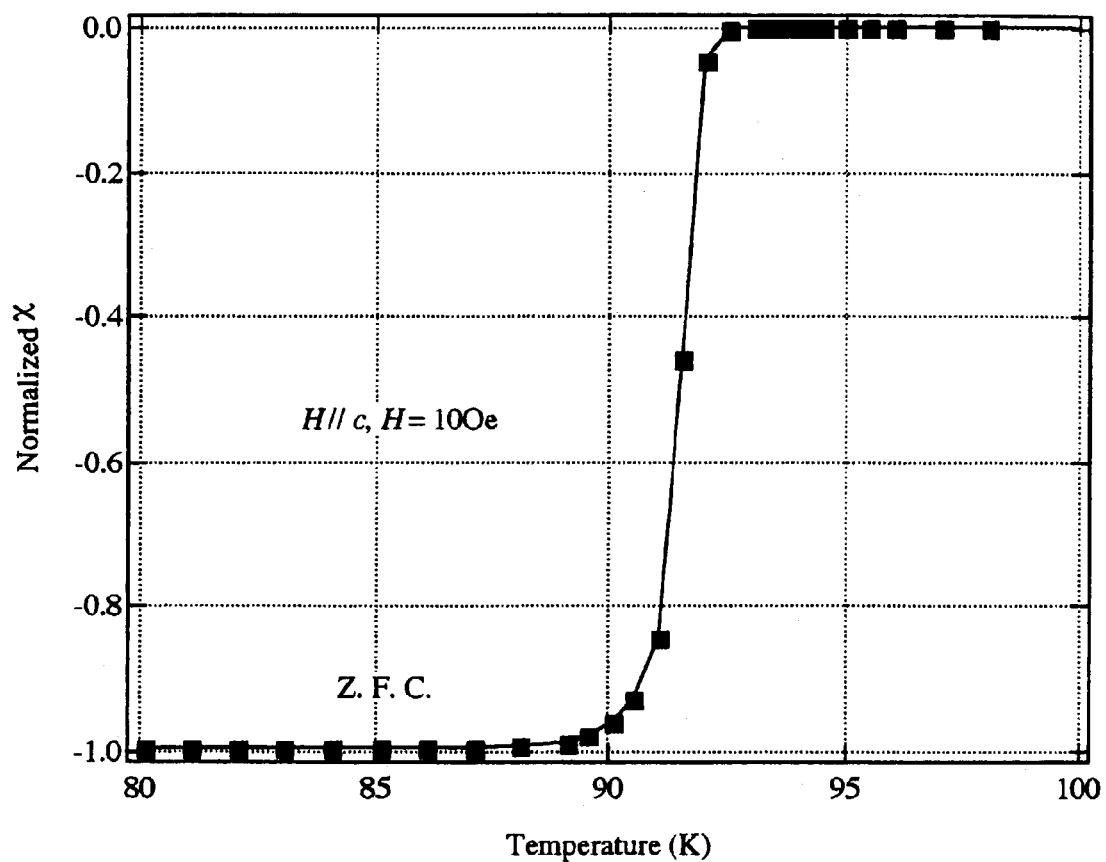
FIG. 4 is a graph of the temperature dependence of the magnetization of the joined product of the present invention.
Figure 5:
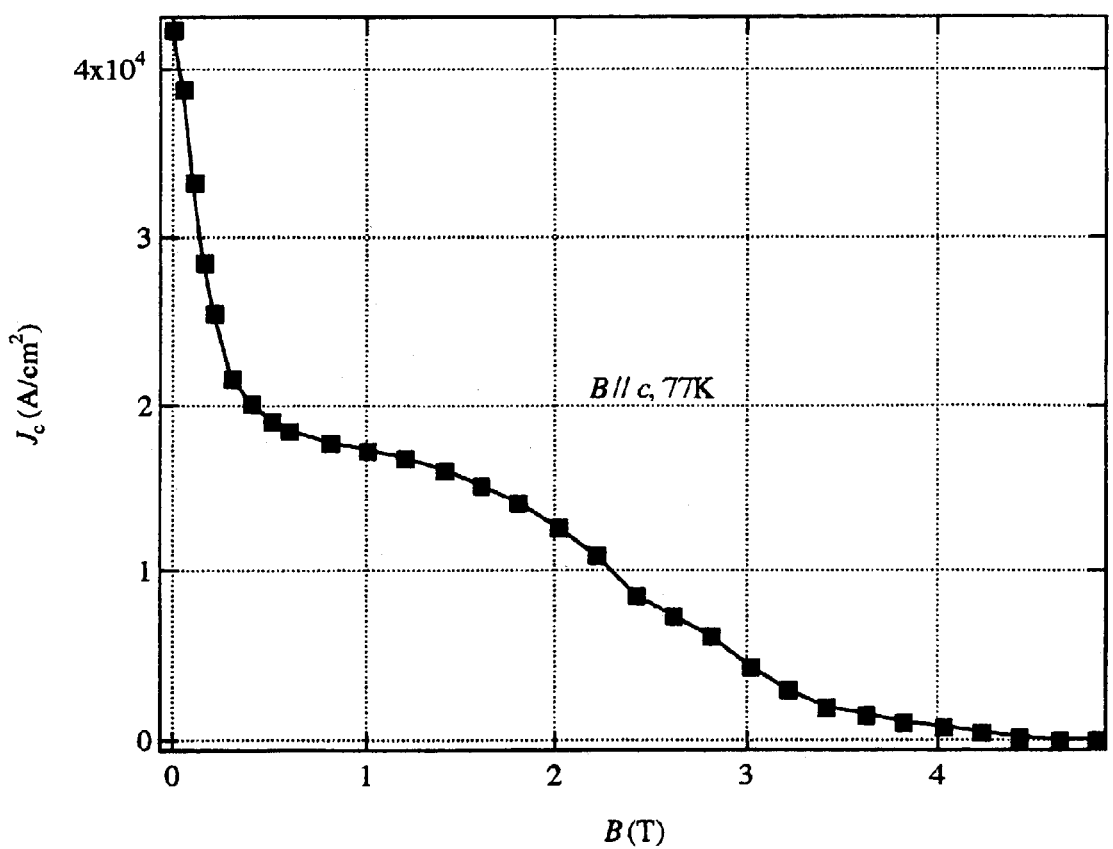
FIG. 5 is a graph of the external magnetic field dependence of the critical current density of the joined product of the present invention.

Next, the superconductivity transition temperature and magnetic field dependence of the critical current density were measured with a superconducting quantum interference device (SQUID) magnetometer. A magnetic field was applied parallel to the c axis of the sample being measured, and an external magnetic field of 10 Oe was applied in the measurement of the superconductivity transition temperature. The temperature was 77 K in the measurement of the magnetic field dependence of the critical current density. The results are shown in FIGS. 4 and 5. The superconductivity transition temperature was 92 K. The critical current density was approximately 13,000 A/cm$^2$ at an external magnetic field of 2 T. The irreversible magnetic field was approximately 4.8 T.

Figure 6:
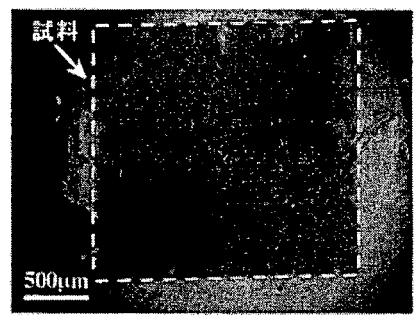
FIG. 6 consists of magneto-optical micrographs of a sample in which the joined plane of the joined product of the present invention is parallel to the (110)
Figure 6:
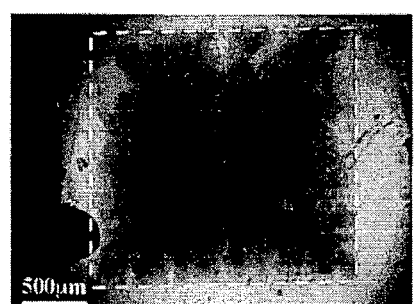
Figure 6:
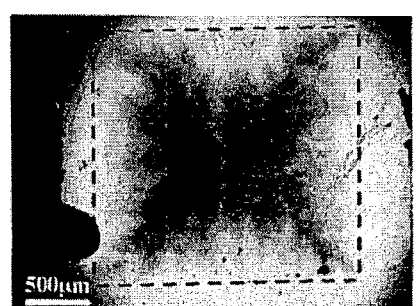
Figure 6:
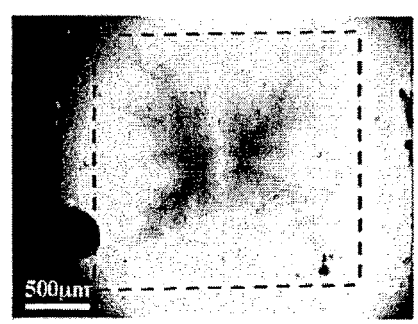

Further, magneto-optical effect (MO) was utilized to measure the magnetic field distribution in order to observe the effect of the external magnetic field on the joint properties. A magnetic field was applied parallel to the c axis of the sample. The results are shown in FIG. 6. The experiment temperature was 77 K. Magnetic flux penetrated into only part of the joint even when an external magnetic field of over 1000 Oe was applied. Penetration of the magnetic flux into the joint was observed at 1400 Oe.

Comparative Example 1

Other than cutting the matrix such that the plane to be joined of the matrix would be parallel to the (100) plane, a joined product was produced in the same manner as in Example 1, and a sample to be evaluated was produced from this joined product by the same procedure as in Example 1.

Figure 7:
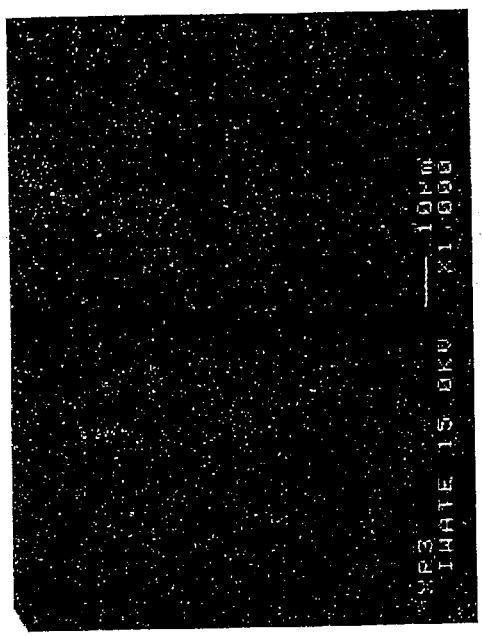
FIG. 7 consists of compositional images and characteristic X-ray images near the interface of the joined product of a comparative example in which the joined plane is parallel to the (100) plane.
Figure 7:
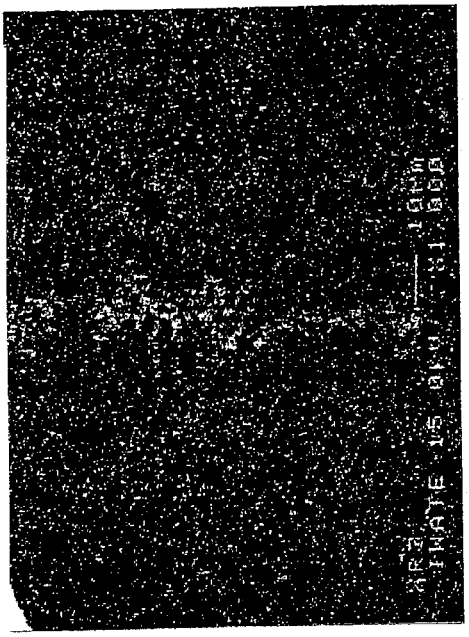
Figure 7:
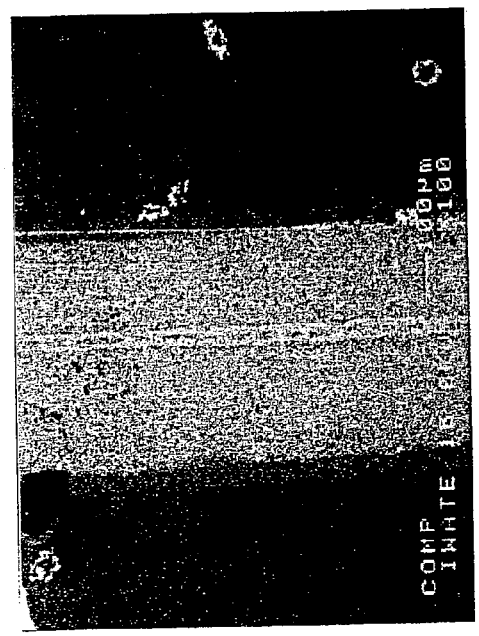
Figure 7:
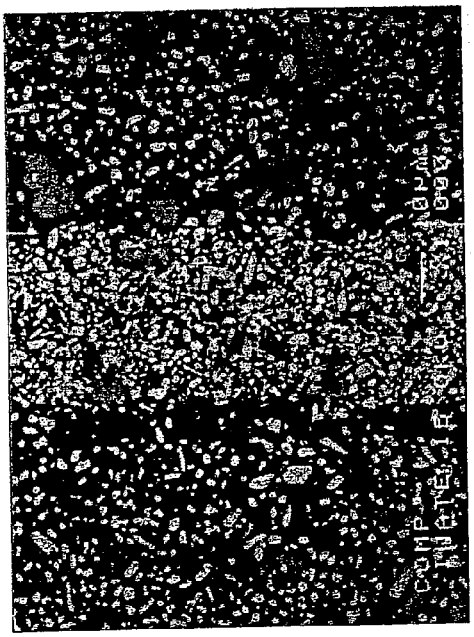

FIG. 7 consists of composition images and characteristic X-ray images (Ba-Mα line and Cu-Kα line) near the joined interface. It can be seen that the joined portion is extremely dense, with no pores visible, indicating that the joining process is successful. However, segregation of CuO was noted in the middle part of the joint.

Next, the superconductivity transition temperature and magnetic field dependence of the critical current density were measured with a SQUID magnetometer. The superconductivity transition temperature of the sample was 92 K. The critical current density was approximately 5000 A/cm$^2$ at an external magnetic field of 2 T. The irreversible magnetic field was approximately 4.0 T.

Figure 8:
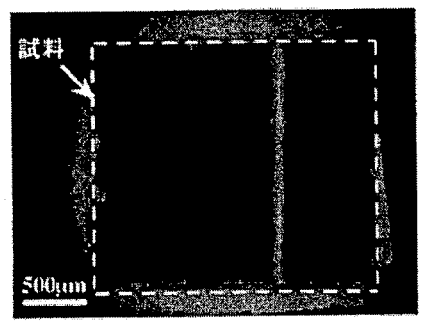
FIG. 8 consists of magneto-optical micrographs of the joined product of a comparative example in which the joined plane is parallel to the (100) plane.
Figure 8:
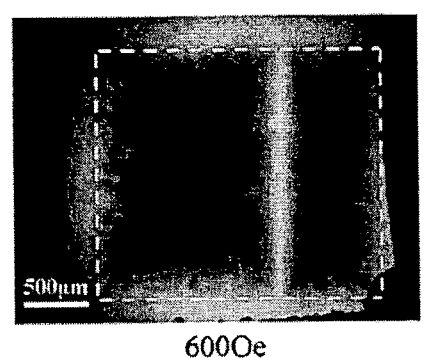
Figure 8:
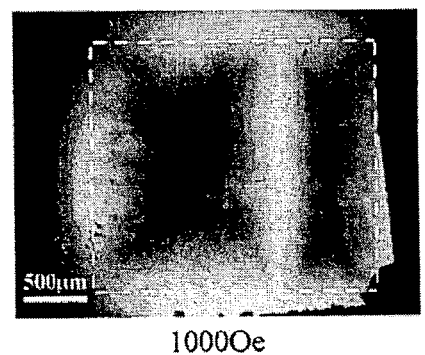
Figure 8:
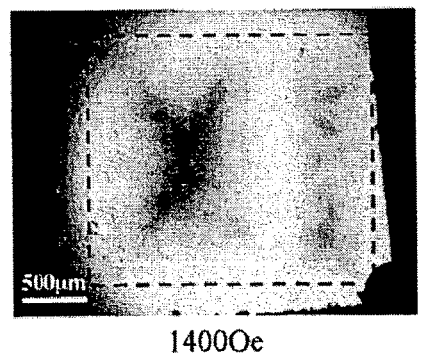
Figure 9:
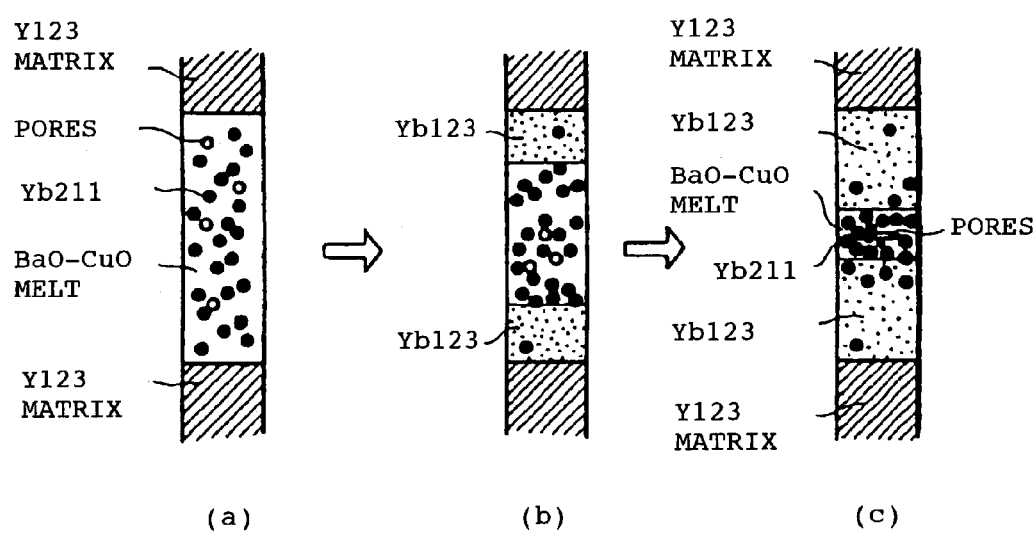
FIG. 9 consists of diagrams to explain the pushing phenomenon seen with a conventional Y123 superconductor bulk joining method.
Figure 10:
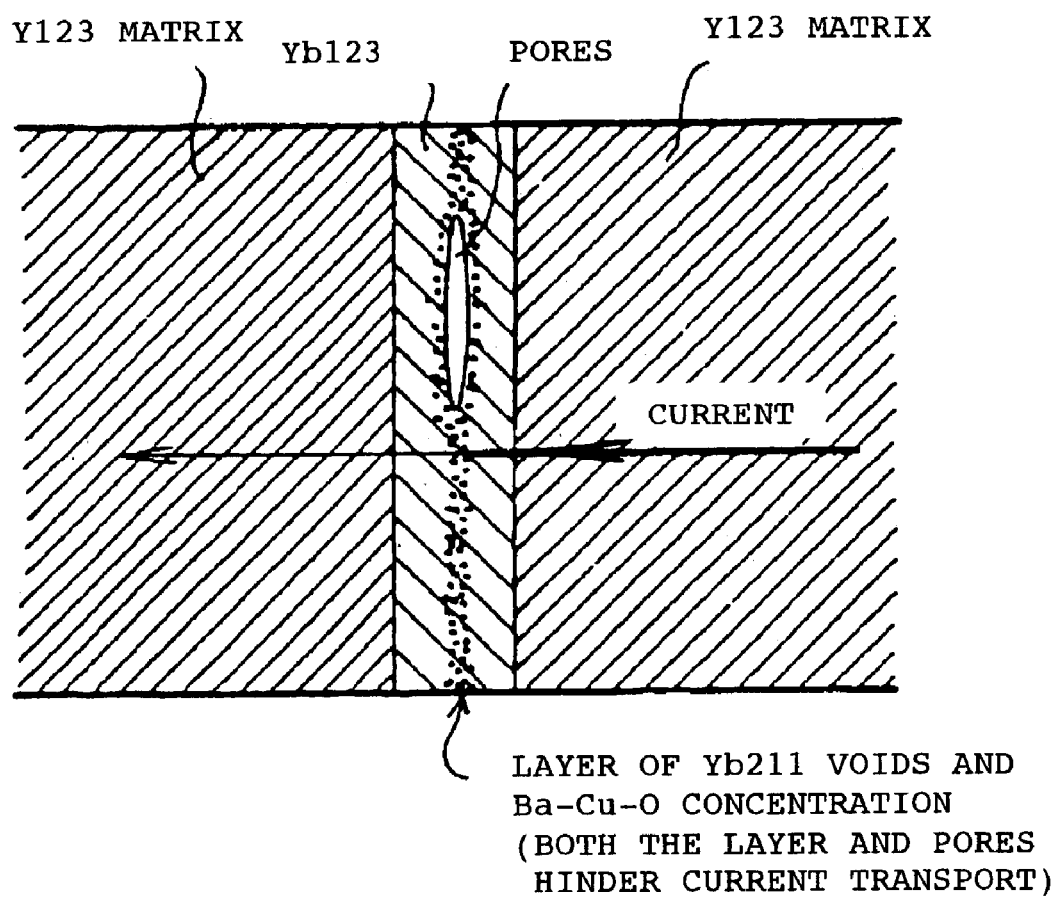
FIG. 10 is a diagram illustrating the pores and segregation of impurities observed at the joint obtained with a conventional Y123 superconductor bulk joining method.

Magneto-optical effect (MO) was then utilized to measure the magnetic field distribution. The results are shown in FIG. 8. The experiment temperature was 77 K. Magnetic flux penetrated completely into the joint when an external magnetic field of about 200 Oe was applied.

Example 2

Joining a Y—Ba—Cu—O Bulk with a Yb—Ba—Cu—O Solder Material

Preparation of Matrix

The matrix was prepared in the same manner as matrix A in Example 1.

Preparation of Solder Material

Raw powders of Yb$_2$O$_3$, BaCO$_3$, and CuO were weighed out such that the composition would be 0.75YbBa$_2$Cu$_3$O$_{7-\delta}$+0.25Yb$_2$BaCuO$_5$, and these were mixed for 3 hours in an automated mortar and pestle. The mixed powder was molded in a uniaxial press, after which it was calcined three times for 24 hours each time at 890° C., two times for 50 hours at 920° C., and one time for 100 hours at 920° C. in a pure oxygen atmosphere. This calcination was repeated until all of the raw powder became two phases of YbBa$_2$Cu$_3$O$_{7-\delta}$ and Yb$_2$BaCuO$_5$.

Platinum was added to the mixed powder having two phases in an amount of 0.5 mass % with respect to the total mass of the mixed powder, and this was mixed for another 3 hours in an automated mortar and pastle. After this mixing, the mixture was molded into a rectangular parallelepiped approximately 18×9×5 mm$^3$ in size, and then pressed in a CIP.

This molding was sintered by heating for 10 hours under atmospheric conditions and at 942° C., which is 10° C. lower than the 952° C. peritectic reaction temperature of the YbBa$_2$Cu$_3$O$_{7-\delta}$.

The sinter thus obtained was cut into a plate with a thickness of approximately 1 mm, and further polished to produce a spacer with a thickness of 0.5 mm. The spacer was polished until both sides had a mirror finish.

Joining

This spacer with a thickness of 0.5 mm was sandwiched between two cut bulks as shown in FIG. 1.

The sample was heated for 3 hours to 995° C., held at this temperature for 1 hour, and then cooled to 945° C. at a rate of 0.5° C. per hour.

Evaluation

After the heat treatment, a sample to be measured was produced from the obtained joined product by the same procedure as in Example 1.

Composition images and characteristic X-ray images (Ba-Mα line and Cu-Kα line) near the joined interface revealed that the joined portion was extremely dense, with no pores visible, indicating that the joining process was successful. Furthermore, it can be seen that there was no segregation of CuO or the like, indicating that the microstructure was extremely uniform.

Next, the superconductivity transition temperature and magnetic field dependence of the critical current density were measured with a SQUID magnetometer, revealing the superconductivity transition temperature to be 92 K. The critical current density was approximately 10,000 A/cm$^2$ at an external magnetic field of 2 T. The irreversible magnetic field was approximately 4.0 T.

Next, magneto-optical effect (MO) was utilized to measure the magnetic field distribution. The experiment temperature was 77 K. Magnetic flux penetrated into only part of the joint even when an external magnetic field of over 500 Oe was applied.

Comparative Example 2

Other than cutting the matrix such that the plane of the matrix to be joined would be parallel to the (100) plane, a joined product was produced in the same manner as in Example 3, and an evaluation sample was produced from this joined product by the same procedure as in Example 3.

Composition images and characteristic X-ray images (Ba-Mα line and Cu-Kα line) near the joined interface revealed that the joined portion was extremely dense, with no pores visible, indicating that the joining process was successful. However, segregation of CuO was noted in the middle part of the joint.

Next, the superconductivity transition temperature and magnetic field dependence of the critical current density were measured with a SQUID magnetometer. The superconductivity transition temperature of the sample was 92 K. The critical current density was approximately 5000 A/cm$^2$ at an external magnetic field of 2 T. The irreversible magnetic field was approximately 3.7 T.

Magneto-optical effect (MO) was then utilized to measure the magnetic field distribution. The experiment temperature was 77 K. Magnetic flux penetrated completely into the joint when an external magnetic field of about 400 Oe was applied.

Example 3

Joining a Y—Ba—Cu—O Bulk with a Y—Ba—Cu—O Solder Material

Preparation of Matrix

The matrix was prepared in the same manner as matrix A in Example 1

Preparation of Solder Material

Raw powders of $Y_2O_3$, $BaCO_3$, and CuO were weighed out such that the composition would be $0.75YBa_2Cu_3O_{7-\delta}+0.25Y_2BaCuO_5$, and these were mixed for 3 hours in an automated mortar and pestle. The mixed powder was molded in a uniaxial press, after which it was calcined for 24 hours at 890° C. in a pure oxygen atmosphere. This calcination was repeated until all of the raw powder became two phases of $YBa_2Cu_3O_{7-\delta}$ and $Y_2BaCuO_5$.

Platinum and $Ag_2O$ were added to the mixed powder having two phases in amounts of 0.5 mass % and 10 mass %, respectively, with respect to the total mass of the mixed powder, and this was mixed for another 3 hours in an automated mortar and pestle. After this mixing, the mixture was molded into a rectangular parallelepiped approximately 18×9×5 mm$^3$ in size, and then pressed in a CIP. This molding was sintered by heating for 10 hours under atmospheric conditions and at 960° C., which is 10°C. lower than the 970° C. peritectic reaction temperature of the $0.75YBa_2Cu_3O_{7-\delta}+0.25Y_2BaCuO_5+0.5$ mass % Pt+10 mass % $Ag_2O$.

The sinter thus obtained was cut into a plate with a thickness of approximately 1 mm, and further polished to produce a spacer with a thickness of 0.5 mm. The spacer was polished until both sides had a mirror finish.

Joining

This spacer with a thickness of 0.5 mm was sandwiched between two cut bulks as shown in FIG. 1. The sample was heated for 3 hours to 950° C., held at this temperature for 1 hour, and then cooled to 900° C. at a rate of 0.5° C. per hour.

Evaluation

After the heat treatment, a sample to be measured was produced from the obtained joined product by the same procedure as in Example 1.

Composition images and characteristic X-ray images (Ba-Mα line and Cu-Kα line) near the joined interface revealed that the joined portion was extremely dense, with no pores visible, indicating that the joining process was succesful. Furthermore, it can be seen that there was no segregation of CuO or the like, indicating that the microstructure was extremely uniform.

Next, the superconductivity transition temperature and magnetic field dependence of the critical current density were measured with a SQUID magnetometer, revealing the superconductivity transition temperature to be 91 K. The critical current density was approximately 12,000 A/cm2 at an external magnetic field of 2 T. The irreversible magnetic field was approximately 5.0 T.

Example 4

Joining an Sm—Ba—Cu—O Bulk with a Gd—Ba—Cu—O Solder Material

Preparation of Matrix

Raw powders of $Sm_2O_3$, $BaCO_3$, and CuO were weighed out such that the composition would be $0.75SmBa_2Cu_3O_{7-\delta}+0.25Sm_2BaCuO_5$, and these were mixed for 3 hours in an automated mortar and pestle. The mixed powder was molded in a uniaxial press, after which it was calcined for 24 hours at 880° C. under atmospheric conditions. After this calcination, the sample was pulverized again and then calcined three more times by the same method as above. Next, the calcined powder was sintered for 24 hours at 980° C. in an atmosphere of 1% $O_2$+99% Ar. The sintering and pulverization were repeated until all of the raw powder became two phases of $SmBa_2Cu_3O_{7-\delta}$ and $Sm_2BaCuO_5$.

Platinum was added to the mixed powder having two phases in an amount of 0.5 mass % with respect to the total mass of the mixed powder, and this was mixed for another 3 hours in an automated mortar and pestle. After this mixing, the mixture was molded into a cylinder with a diameter of 30 mm and a height of 12 mm, and then pressed in a CIP.

This molding was placed on a rod of yttrium-stabilized $ZrO_2$ and set in a tube furnace with a controllable firing atmosphere. The sample was heated for 3 hours to 1150° C. in an atmosphere of 1% $O_2$+99% Ar, and after being held at this temperature for 1 hour was immediately cooled to 1020° C. over a period of 15 minutes. $NdBa_2Cu_3O_{7-\delta}$ seed crystal, which had been produced in advance by melt solidification process, was placed on the sample during this cooling. After this, the sample was cooled down to 960° C. at a rate of 0.75° C. per hour. The sample thus produced was in the form of single domain with a uniform crystal orientation.

The samarium-based superconducting oxide material bulk obtained above was cut into a 3×4×5 mm³ (a plane to be joined was 4×5 mm²) rectangular parallelepiped such that the plane to be joined was parallel to the (110) plane. The joining surface of this cut sample was polished to a mirror finish.

Preparation of Solder Material

Raw powders of $Gd_2O_3$, $BaCO_3$, and CuO were weighed out such that the composition would be $0.75GdBa_2Cu_3O_{7-\delta}+0.25Gd_2BaCuO_5$, and these were mixed for 3 hours in an automated mortar and pestle. The mixed powder was molded in a uniaxial press, after which it was calcined for 24 hours at 880° C. under atmospheric conditions. After the calcination, the sample was pulverized again and then calcined three more times by the same method as above. Next, the calcined powder was sintered for 24 hours at 965° C. in an atmosphere of 1% $O_2$+99% Ar. The sintering and pulverization were repeated until all of the raw powder became two phases of $GdBa_2Cu_3O_{7-\delta}$ and $Gd_2BaCuO_5$.

Platinum was added to the mixed powder having two phases in an amount of 0.5 mass % with respect to the total mass of the mixed powder, and this was mixed for another 3 hours in an automated mortar and pestle. After this mixing, the mixture was molded into a rectangular parallelepiped approximately 18×9×5 mm³ in size, and then pressed in a CIP.

This molding was sintered by heating for 10 hours in an atmosphere of 1% $O_2$+99% Ar and at 975° C., which is 10° C. lower than the 985° C. peritectic reaction temperature of the $GdBa_2Cu_3O_{7-\delta}$.

The sinter thus obtained was cut into a plate with a thickness of approximately 1 mm, and further polished to produce a spacer with a thickness of 0.5 mm. The spacer was polished until both sides had a mirror finish.

Joining

This spacer with a thickness of 0.5 mm was sandwiched between two cut bulks as shown in FIG. 1. The sample was heated for 3 hours to 1000° C. in an atmosphere of 1% $O_2$+99% Ar, held at this temperature for 1 hour, and then cooled to 950° C. at a rate of 0.5° C. per hour.

Evaluation

After the heat treatment, a sample was cut from the obtained joined product so as to include the joined interface as shown in FIG. 2, part of this was polished in order to observe the microstructure at the joined interface, and the other part was subjected to oxygen annealing, in which the temperature was raised to 450° C. over 3 hours in an oxygen atmosphere, then the temperature was lowered to 300° C. over 50 hours, and finally the temperature was held there for 150 hours, in order to evaluate the superconductivity characteristics.

Texture images and characteristic X-ray images (Ba-Mα line and Cu-Kα line) near the joined interface revealed that the joined portion was extremely dense, with no pores visible, indicating that the joining process was successful. Furthermore, it can be seen that there was no segregation of CuO or the like, indicating that the microstructure was extremely uniform.

Next, the superconductivity transition temperature and magnetic field dependence of the critical current density were measured with a SQUID magnetometer. The superconductivity transition temperature of the sample was 94 K. The critical current density was approximately 20,000 A/cm² at an external magnetic field of 2 T. The irreversible magnetic field was approximately 6.0 T.

Example 5

Joining an Sm—Ba—Cu—O/Ag Bulk with a Gd—Ba—Cu—O/Ag Solder Material

Preparation of Matrix

A silver-added samarium-based superconducting oxide material bulk (single domain with c-axis orientation; made by Nippon Steel Corporation) was cut into a 3×4×5 mm³ (a plane to be joined was 4×5 mm²) rectangular parallelepiped such that the plane to be joined was parallel to the (110) plane. The joining surface of this cut sample was polished to a mirror finish to produce a matrix to be joined.

Preparation of Solder Material

Commercially available raw powders of $GdBa_2Cu_3O_{7-\delta}$ and $Gd_2BaCuO_5$ were weighed out such that the composition would be $0.75GdBa_2Cu_3O_{7-\delta}+0.25Gd_2BaCuO_5$, and these were mixed for 3 hours in an automated mortar and pestle. Pt and $Ag_2O$ were added to the mixed powder in amounts of 0.5 mass % and 10 mass %, respectively, with respect to the total mass of the mixed powder, and this was mixed for another 3 hours in an automated mortar and pestle. After this mixing, the mixture was molded into a rectangular parallelepiped approximately 18×9×5 mm³ in size, and then pressed in a CIP.

This molding was sintered by heating under atmospheric conditions and at 1000° C., which is 10° C. lower than the 1010° C. peritectic reaction temperature of the $GdBa_2Cu_3O_{7-\delta}+Ag_2O$. The sinter thus obtained was cut into a plate with a thickness of approximately 1 mm, and further polished to produce a spacer with a thickness of 0.5 mm. The spacer was polished until both sides had a mirror finish.

Joining

This spacer with a thickness of 0.5 mm was sandwiched between two cut bulks as shown in FIG. 1. The sample was heated for 3 hours to 1023° C. under atmospheric conditions, held at this temperature for 1 hour, and then cooled to 973° C. at a rate of 0.5° C. per hour.

Evaluation

After the heat treatment, a sample to be measured was cut from the obtained joined product so as to include the joined interface as shown in FIG. 2, part of this was polished in order to observe the microstructure at the joined interface, and the other part was subjected to oxygen annealing, in which the temperature was raised to 450° C. over 3 hours in an oxygen atmosphere, then the temperature was lowered to 300° C. over 50 hours, and finally the temperature was held there for 150 hours, in order to evaluate the superconductivity characteristics.

Texture images and characteristic X-ray images (Ba-Mα line, Cu-Kα line, and Ag-Mα line) near the joined interface revealed that the joined portion was extremely dense, with no pores visible, indicating that the joining process was succesful. Furthermore, it can be seen that there was no segregation of CuO, silver, or the like, indicating that the microstructure was extremely uniform.

Figure 11:
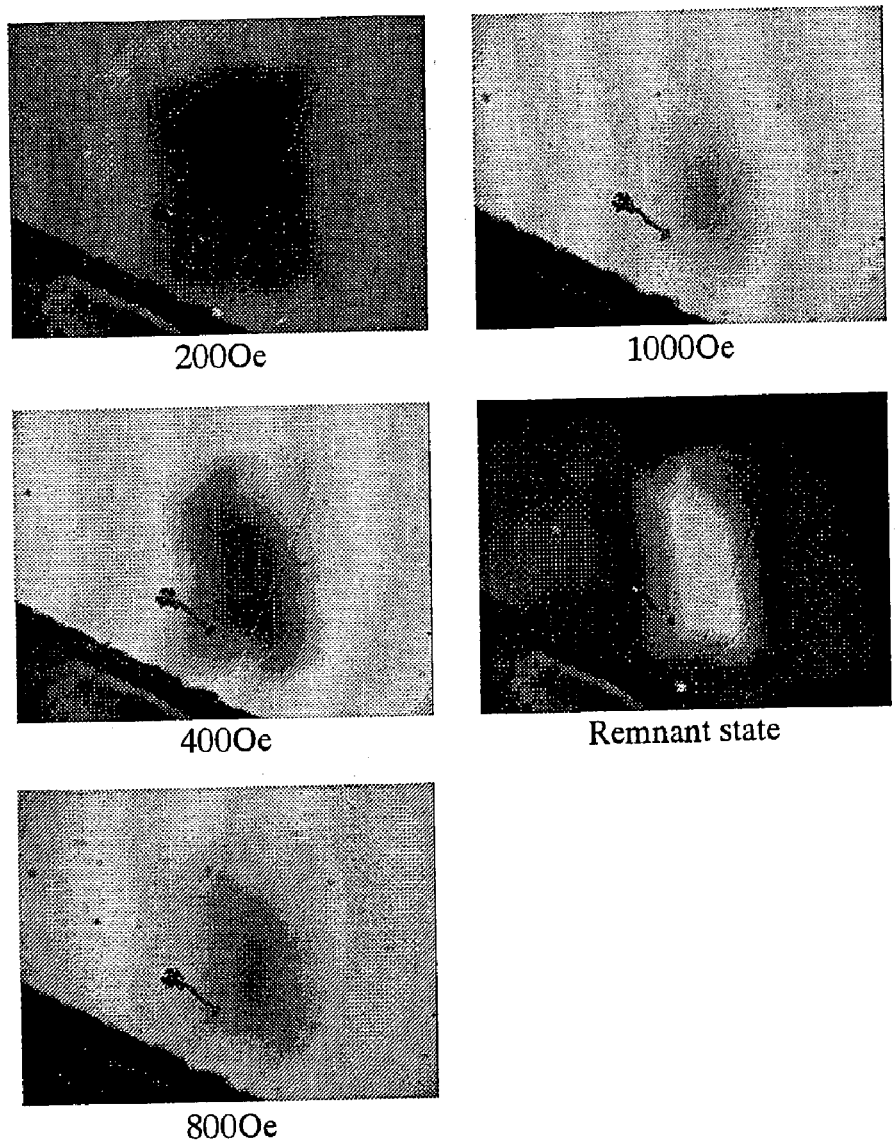
FIG. 11 consists of magneto-optical micrographs of the joined product of the present invention in which the joined plane is parallel to the (110) plane.

Next, magneto-optical effect (MO) was utilized to measure the magnetic field distribution. The results obtained are shown in FIG. 11. The experiment temperature was 77 K. No magnetic flux penetrated into the joint even when an external magnetic field of 1000 Oe or more was applied. Furthermore, it was confirmed that the sample completely trapped the magnetic field when an external magnetic field of 2000 Oe was applied and the external magnetic field was then removed.

Example 6

Joining an Nd—Ba—Cu—O Bulk with an Sm—Ba—Cu—O Solder Material

Preparation of Matrix

Raw powders of $Nd_2O_3$, $BaCO_3$, and CuO were weighed out such that the composition would be $0.875NdBa_2Cu_3O_{7-\delta}+0.125Nd_4Ba_2Cu_2O_{10}$, and these were mixed for 3 hours in an automated mortar and pestle. The mixed powder was molded in a uniaxial press, after which it was calcined for 24 hours at 880° C. under atmospheric conditions. After this calcination, the sample was pulverized again and then calcined three more times by the same method as above. Next, the calcined powder was sintered for 24 hours at 980° C. in an atmosphere of 1% $O_2$+99% Ar. The sintering and pulverization were repeated until all of the raw powder became two phases of $NdBa_2Cu_3O_{7-\delta}$ and $Nd_4Ba_2Cu_2O_{10}$.

CeO2 was added to the mixed powder having two phases in an amount of 1.0 mass % with respect to the total mass of the mixed powder, and this was mixed for another 3 hours in an automated mortar and pestle. After this mixing, the mixture was molded into a cylinder with a diameter of 30 mm and a height of 12 mm, and then pressed in a CIP.

This molding was placed on a rod of yttrium-stabilized $ZrO_2$ and set in a tube furnace with a controllable firing atmosphere. The sample was heated for 3 hours to 1150° C. in an atmosphere of 1% $O_2$+99% Ar, after being held at this temperature for 1 hour, then the sample was immediately cooled to 1045° C. over a period of 15 minutes. $NdBa_2Cu_3O_{7-\delta}$ seed crystal, which had been produced in advance by melt solidification process, was placed on the sample during this cooling. After this, the sample was cooled down to 970° C. at a rate of 0.75° C. per hour. The sample thus produced was in the form of single domain with a uniform crystal orientation.

The neodymium-based superconducting oxide material bulk obtained above was cut into a $3\times4\times5$ $mm^3$ (a plane to be joined was $4\times5$ $mm^2$) rectangular parallelepiped such that the plane to be joined was parallel to the (110) plane. The surface of this cut sample to be joined was polished to a mirror finish.

Preparation of Solder Material

Raw powders of $Sm_2O_3$, $BaCO_3$, and CuO were weighed out such that the composition would be $0.75SmBa_2Cu_3O_{7-\delta}+0.25Sm_2BaCuO_5$, and these were mixed for 3 hours in an automated mortar and pestle. The mixed powder was molded in a uniaxial press, after which it was calcined for 24 hours at 880° C. under atmospheric conditions. After this calcination, the sample was pulverized again and then calcined three more times by the same method as above. Next, the calcined powder was sintered for 24 hours at 980° C. in an atmosphere of 1% $O_2$+99% Ar. The sintering and pulverization were repeated until all of the raw powder became two phases of $SmBa_2Cu_3O_{7-\delta}$ and $Sm_2BaCuO_5$.

Platinum was added to the mixed powder having two phases in an amount of 0.5 mass % with respect to the total mass of the mixed powder, and this was mixed for another 3 hours in an automated mortar and pestle. After this mixing, the mixture was molded into a rectangular parallelepiped approximately $18\times9\times5$ $mm^3$ in size, and then pressed in a CIP.

This molding was sintered by heating for 10 hours in an atmosphere of 1% $O_2$+99% Ar and at 1008° C., which is 10° C. lower than the 1018° C. peritectic reaction temperature of the $SmBa_2Cu_3O_{7-\delta}$.

The sinter thus obtained was cut into a plate with a thickness of approximately 1 mm, and further polished to produce a spacer with a thickness of 0.5 mm. The spacer was polished until both sides had a mirror finish.

Joining

This spacer with a thickness of 0.5 mm was sandwiched between two cut bulks as shown in FIG. 1. The sample was heated for 3 hours to 1030° C. in an atmosphere of 1% $O_2$+99% Ar, held at this temperature for 1 hour, and then cooled to 980° C. at a rate of 0.5° C. per hour.

Evaluation

After the heat treatment, a sample was cut from the obtained joined product so as to include the joined interface as shown in FIG. 2, part of this was polished in order to observe the microstructure at the joined interface, and the other part was subjected to oxygen annealing, in which the temperature was raised to 450° C. over 3 hours in an oxygen atmosphere, then the temperature was lowered to 300° C. over 50 hours, and finally the temperature was held there for 150 hours, in order to evaluate the superconductivity characteristics.

Texture images and characteristic X-ray images (Ba-Mα line and Cu-Kα line) near the joined interface revealed that the joined portion was extremely dense, with no pores visible, indicating that the joining process was successful. Furthermore, it can be seen that there was no segregation of CuO or the like, indicating that the microstructure was extremely uniform.

Next, the superconductivity transition temperature and magnetic field dependence of the critical current density were measured with a SQUID magnetometer. The superconductivity transition temperature of the sample was 95 K. The critical current density was approximately 25,000 A/cm$^2$ at an external magnetic field of 2 T. The irreversible magnetic field was approximately 6.0 T.

Example 7

Joining an [Nd, Eu, Gd]—Ba—Cu—O Bulk with a Gd—Ba—Cu—O Solder Material

Preparation of Matrix

Raw powders of $Nd_2O_3$, $Eu_2O_3$, $Gd_2O_3$, $BaCO_3$, and CuO were weighed out such that the composition would be $0.90(Nd_{0.33}Eu_{0.33}Gd_{0.33})Ba_2Cu_3O_{7-\delta}+0.10$ $(Nd_{0.33}Eu_{0.33}Gd_{0.33})_2BaCuO_5$, and these were mixed for 3 hours in an automated mortar and pestle. The mixed powder was molded in a uniaxial press, after which it was calcined for 24 hours at 880° C. under atmospheric conditions. After this calcination, the sample was pulverized again and then calcined three more times by the same method as above. The calcined powder was then sintered for 24 hours at 950° C. in an atmosphere of 0.1% $O_2$+99.9% Ar. The sintering and pulverization were repeated until all of the raw powder became two phases of $(Nd_{0.33}Eu_{0.33}Gd_{0.33})Ba_2Cu_3O_{7-\delta}$ and $(Nd_{0.33}Eu_{0.33}Gd_{0.33})_2BaCuO_5$.

Platinum was added to the mixed powder having two phases in an amount of 0.5 mass % with respect to the total mass of the mixed powder, and this was mixed for another 3 hours in an automated mortar and pestle. After this mixing, the mixture was molded into a cylinder with a diameter of 30 mm and a height of 12 mm, and then pressed in a CIP.

This molding was placed on a rod of yttrium-stabilized $ZrO_2$ and set in a tube furnace with a controllable firing atmosphere. The sample was heated for 3 hours to 1075° C. in an atmosphere of 0.1% $O_2$+99.9% Ar, and after being held at this temperature for 1 hour was immediately cooled to 1005° C. over a period of 15 minutes. $NdBa_2Cu_3O_{7-\delta}$ seed crystal, which had been produced in advance by melt solidification process, was placed on the sample during this supercooling. After this, the sample was cooled down to 950° C. at a rate of 0.5° C. per hour. The sample thus produced was in the form of a single domain with a uniform crystal orientation.

The $(Nd_{0.33}Eu_{0.33}Gd_{0.33})$ $Ba_2Cu_3O_{7-\delta}$-based superconducting oxide material bulk obtained above was cut into a 3×4×5 mm$^3$ (a plane to be joined was 4×5 mm$^2$) rectangular parallelepiped such that the plane to be joined was parallel to the (110) plane. The surface of this cut sample to be joined was polished to a mirror finish.

Preparation of Solder Material

Raw powders of $Gd_2O_3$, $BaCO_3$, and CuO were weighed out such that the composition would be $0.90GdBa_2Cu_3O_{7-\delta}+0.10Gd_2BaCuO_5$, and these were mixed for 3 hours in an automated mortar and pestle. The mixed powder was molded in a uniaxial press, after which it was calcined for 24 hours at 880° C. under atmospheric conditions. After this calcination, the sample was pulverized again and then calcined three more times by the same method as above. Next, the calcined powder was sintered for 24 hours at 965° C. in an atmosphere of 1% $O_2$+99% Ar. The sintering and pulverization were repeated until all of the raw powder became two phases of $GdBa_2Cu_3O_{7-\delta}$ and $Gd_2BaCuO_5$.

Platinum was added to the mixed powder composed of two phases in an amount of 0.5 mass % with respect to the total mass of the mixed powder, and this was mixed for another 3 hours in an automated mortar and pestle. After this mixing, the mixture was molded into a rectangular parallelepiped approximately 18×9×5 mm$^3$ in size, and then pressed in a CIP.

This molding was sintered by heating for 10 hours in an atmosphere of 1% $O_2$+99% Ar and at 975° C., which is 10° C. lower than the 985° C. peritectic reaction temperature of the $GdBa_2Cu_3O_{7-\delta}$.

The sinter thus obtained was cut into a plate with a thickness of approximately 1 mm, and further polished to produce a spacer with a thickness of 0.5 mm. The spacer was polished until both sides had a mirror finish.

Joining

This spacer with a thickness of 0.5 mm was sandwiched between two cut bulks as shown in FIG. 1. The sample was heated for 3 hours to 975° C. in an atmosphere of 0.1% $O_2$+99.9% Ar, held at this temperature for 1 hour, and then cooled to 925° C. at a rate of 0.5° C. per hour.

Evaluation

After the heat treatment, a sample was cut from the obtained joined product so as to include the joined interface as shown in FIG. 2, part of this was polished in order to observe the microstructure at the joined interface, and the other part was subjected to oxygen annealing, in which the temperature was raised to 450° C. over 3 hours in an oxygen atmosphere, then the temperature was lowered to 300° C., taking 50 hours, and finally the temperature was held there for 150 hours, in order to evaluate the superconductivity characteristics.

Texture images and characteristic X-ray images (Ba-Mα line and Cu-Kα line) near the joined interface revealed that the joined portion was extremely dense, with no pores visible, indicating that the joining process was successful. Furthermore, it can be seen that there was no segregation of CuO or the like, indicating that the microstructure was extremely uniform.

Next, the superconductivity transition temperature and magnetic field dependence of the critical current density were measured with a SQUID magnetometer. The superconductivity transition temperature of the sample was 94 K. The critical current density was approximately 50,000 A/cm$^2$ at an external magnetic field of 2 T. The irreversible magnetic field was approximately 6.5 T.

Example 8

Joining a Y—Ba—Cu—O Bulk with an Er—Ba—Cu—O Solder Material

A joined product was produced in the same manner as in Example 1, except that the molding CIP-treated and served as the solder material was processed to a thickness of 0.5 mm without sintering, and the resulting molding (compact) was used as a spacer.

An evaluation sample was produced from the resulting joined product and evaluated by the same procedure as in Example 1.

Texture images and characteristic X-ray images (Ba-Mα line and Cu-Kα line) near the joined interface revealed some pores in the joint, but there was no segregation of CuO or the like, indicating that the microstructure was extremely uniform.

Next, the superconductivity transition temperature and magnetic field dependence of the critical current density were measured with a SQUID magnetometer. The superconductivity transition temperature of this sample was 92 K. The critical current density was approximately 7000 A/cm$^2$ at an external magnetic field of 2 T. The irreversible magnetic field was approximately 3.5 T.

Comparative Example 3

Preparation of Matrix

A yttrium-based superconducting oxide material bulk in the form of single domain oriented along the c axis (QMG made by Nippon Steel Corporation) was cut into a 3×4×5 mm$^3$ (a plane to be joined was 4×5 mm$^2$) rectangular parallelepiped such that the plane to be joined was parallel to the (100) plane. The cut sample was polished until both sides had a mirror finish.

Preparation of Solder Material

Raw powders of $Yb_2O_3$, $BaCO_3$, and CuO were weighed out such that the composition would be $YbBa_2Cu_3O_{7-\delta}$, and these were mixed for 3 hours in an automated mortar and pestle. The mixed powder was molded in a uniaxial press, after which it was calcined three times for 24 hours each time at 890° C., two times for 50 hours at 920° C., and one time for 100 hours at 920° C. in a pure oxygen atmosphere. This calcination was repeated until all of the raw powder became a single phase of $YbBa_2Cu_3O_{7-\delta}$.

The $YbBa_2Cu_3O_{7-\delta}$ powder was mixed in ethanol to produce a slurry. This slurry was centrifuged to adjust its concentration to about 70%.

Joining

The joining surfaces of the yttrium-based superconducting oxide material bulks were coated with this slurry and sandwiched together as shown in FIG. 1. The sample was heated to 300° C. to completely remove the binder. The sample was then heated for 3 hours up to 995° C., held at this temperature for 1 hour, and then cooled down to 945° C. at a rate of 0.5° C. per hour.

Evaluation

After the heat treatment, a sample to be measured was produced from the obtained joined product by the same procedure as in Example 1.

Texture images and characteristic X-ray images (Ba-Mα line and Cu-Kα line) near the joined interface revealed numerous pores. A great deal of segregation of CuO was also seen.

Next, the superconductivity transition temperature and magnetic field dependence of the critical current density were measured with a SQUID magnetometer. A magnetic field was applied parallel to the c axis of the sample being measured, and an external magnetic field of 10 Oe was applied in the measurement of the superconductivity transition temperature. The temperature was 77 K in the measurement of the magnetic field dependence of the critical current density. The superconductivity transition temperature of this sample was 92 K. The critical current density was approximately 50 $A/cm^2$ at an external magnetic field of 2 T. The irreversible magnetic field was approximately 2.9 T.

The compositions of the matrices and solder materials, the properties of the joined products, and so forth in the examples and comparative examples given above are compiled in Table 1 below.

TABLE 1

Compositions of matrices and joining materials and evaluation results

| | Matrix | | Joining material | | Joining interface | | Tc (*1) (K) | Jc (*2) (A/cm²) | Irreversible mag. field (T) |
|---|---|---|---|---|---|---|---|---|---|
| | Comp. | Joining plane | Main phase | Form | Pores | Segregation | | | |
| Ex. 1 | Y123 | (110) | Er123 | sinter | no | no | 92 | app. 13,000 | app. 4.8 |
| C. E. 1 | Y123 | (100) | Er123 | sinter | no | yes | 92 | app. 5000 | app. 4.0 |
| Ex. 2 | Y123 | (110) | Yb123 | sinter | no | no | 92 | app. 10,000 | app. 4.0 |
| C. E. 2 | Y123 | (100) | Yb123 | sinter | no | yes | 92 | app. 5000 | app. 3.7 |
| Ex. 3 | Y123 | (110) | Y123 | sinter | no | no | 91 | app. 12,000 | app. 5.0 |
| Ex. 4 | Sm123 | (110) | Gd123 | sinter | no | no | 94 | app. 20,000 | app. 6.0 |
| Ex. 5 | Sm123 | (110) | Gd123 | sinter | no | no | 95 | app. 25,000 | app. 6.0 |
| Ex. 6 | Nd123 | (110) | Sm123 | sinter | no | no | 95 | app. 25,000 | app. 6.0 |
| Ex. 7 | (Nd,Eu,Gd) 123 | (110) | Gd123 | sinter | no | no | 94 | app. 50,000 | app. 6.5 |
| Ex. 8 | Y123 | (110) | Er123 | compact | a few | no | 92 | app. 7000 | app. 3.5 |
| C. E. 3 | Y123 | (100) | Yb123 | slurry | many | much | 92 | app. 50 | app. 2.9 |

*1 Tc: superconductivity transition temperature
*2 Jc: critical current density at external magnetic field 2T
C.E.: Comparative Example It is clear from the results in Table 1 above that when the plane to be joined of the matrix was parallel to the (110) plane as in the present invention, the joined surfaces were more strongly coupled together and a higher critical current density was obtained than when a plane parallel to the (100) plane was used for the joined plane as in the past.

It can also be seen there that a joined product with fewer pores in the joining layer and a higher critical current density was obtained than when a compact was used in a case in which a sinter was used as the solder material.

In the above examples, a sinter or compact was used as the sheet-form solder material, but using a melt-processed plate will yield the same results as when a sinter is used.

INDUSTRIAL APPLICABILITY

With the joining method of the present invention, pores and CuO segregation can be greatly reduced in the joined portion, and it is possible to produce a large superconductor with uniform crystal orientation, without sacrificing the superconductivity characteristics of the superconductor including the joined portion. A joined oxide superconductor produced by the joining method of the present invention can be used as a material for magnetic shields, superconducting magnetic load transport system and superconducting permanent magnets, so the present invention is extremely useful for industrial purposes.

The invention claimed is:

1. A method for joining an RE123 oxide superconductor produced by a melt process, comprising:
   aligning a plane to be joined of an RE123 oxide superconductor so as to be parallel to the (110) crystallographic plane;
   interposing a solder material composed of an RE123 oxide superconductor material having a lower melting point than the RE123 oxide superconductor between the planes to be joined; and
   melting and then solidifying said solder material to form a joining layer, wherein RE is one or more members selected from the group consisting of Y, La, Pr, Nd, Sm, Eu, Gd, Dy, Ho, Er, Tm, Yb and Lu.

2. The method of claim 1, wherein the solder material is a sinter or a melt-processed plate.

3. The method of claim 2, wherein a surface of the solder material is finely polished.

4. The method of claim 1, wherein the solder material is a powder, a slurry, or a molded powder.

5. The method of claim 1, wherein the RE123 oxide superconductor contains a non-superconducting phase including RE.

6. The method of claim 5, wherein the non-superconducting phase is an $RE_2BaCuO_5$ phase as a RE211 phase, and/or an $RE_{4-x}Ba_{2+x}Cu_2O_{10-y}$ phase, as a RE422 phase, wherein $0 \leq x \leq 0.2$, $0 \leq y \leq 0.5$.

7. The method of claim 5, wherein the non-superconducting phase is an $RE_2BaCuO_5$ phase, as a RE211 phase, and/or an $RE_{4-2x}Ba_{2+2x}Cu_{2-x}O_{10-y}$ phase, as a RE422 phase, wherein $0 \leq x \leq 0.3$, $0 \leq y \leq 0.6$.

8. The method of claim 1, wherein the RE123 oxide superconductor contains one or more members of the group consisting of Ag, Pt, $CeO_2$, and $Ag_2O$.

9. The method of claim 1, wherein the solder material contains one or more members of the group consisting of Ag, Pt, $CeO_2$, and $Ag_2O$.

10. The method of claim 1, wherein a pressure is applied during joining.

11. A joined RE123 oxide superconductor produced by the method of claim 1, in which (110) planes of a plurality of RE123 oxide superconductors produced by a melt process have been joined with a solder material composed of an RE123 oxide superconductor material having a lower melting point than the RE123 oxide superconductor to be joined, wherein RE is one or more members selected from the group consisting of Y, La, Pr, Nd, Sm, Eu, Gd, Dy, Ho, Er, Tm, Yb and Lu.

* * * * *